(12) United States Patent
Kim et al.

(10) Patent No.: US 8,842,714 B2
(45) Date of Patent: Sep. 23, 2014

(54) ELECTRONIC DEVICE WITH DYNAMIC NOISE SPECTRUM CONTROL

(75) Inventors: Moon Jung Kim, Palo Alto, CA (US); Geertjan Joordens, Los Gatos, CA (US); Paolo Sacchetto, Cupertino, CA (US); Wonjae Choi, Cupertino, CA (US); Altan N. Yazar, Los Altos, CA (US); Jaydeep V. Ranade, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 267 days.

(21) Appl. No.: 13/417,078

(22) Filed: Mar. 9, 2012

(65) Prior Publication Data

US 2013/0235906 A1    Sep. 12, 2013

(51) Int. Cl.
*H04B 1/00* (2006.01)
(52) U.S. Cl.
USPC ............................ 375/144; 375/148; 375/373
(58) Field of Classification Search
CPC ........ H04B 1/715; H04B 1/7097; H04B 1/71; H04B 1/7103; H04B 1/7107; H04B 1/711; H04B 1/7113; H04B 1/7115; H04B 1/712; H04B 3/20; H04B 3/238; H04B 2/32; H04B 1/10; H04B 1/1027; H04B 1/1036; H04L 1/0078; H04L 1/009; H04L 27/2691; H04L 27/2694
USPC ......... 375/144, 148, 284, 285, 346, 347, 371, 375/373
See application file for complete search history.

(56) References Cited

U.S. PATENT DOCUMENTS

| 5,586,149 | A | 12/1996 | Connell et al. | |
|---|---|---|---|---|
| 5,821,988 | A | 10/1998 | Citta et al. | |
| 6,741,636 | B1 | 5/2004 | Lender | |
| 6,999,723 | B2 | 2/2006 | Kusbel | |
| 7,089,158 | B2 | 8/2006 | Sternberg et al. | |
| 7,136,622 | B2 | 11/2006 | Rofougaran et al. | |
| 7,236,534 | B1 | 6/2007 | Morejon et al. | |
| 2002/0094044 | A1* | 7/2002 | Kolze et al. | 375/346 |
| 2003/0198307 | A1* | 10/2003 | Neill et al. | 375/346 |

(Continued)

FOREIGN PATENT DOCUMENTS

WO    9857454    12/1998

OTHER PUBLICATIONS

Raghuveer Karnati, Design for Signal Integrity, Center for Systems Integration, Florida Atlantic University, 2008.

*Primary Examiner* — Dac Ha
(74) *Attorney, Agent, or Firm* — Treyz Law Group; G. Victor Treyz; Jason Tsai

(57) ABSTRACT

An electronic device may contain clock circuits, transmitters, and other circuits that serve as sources of noise signals. The noise signals may be characterized by a noise spectrum. The noise spectrum produced by a noise source can be adjusted by adjusting spread spectrum clock circuitry in a clock circuit, by adjusting data scrambling circuitry in a transmitter circuit, or by making other dynamic adjustments to the circuitry of the electronic device. During operation of the electronic device, sensitive circuitry in the device such as wireless receiver circuitry may be adversely affected by the presence of noise from a noise source in the device. Based on information such as which receiver bands and/or channels are being actively received and target sensitivity levels for the receiver circuitry, control circuitry within the electronic device can determine in real time how to minimize interference between the noise source and the wireless receiver circuitry.

19 Claims, 8 Drawing Sheets

(56) References Cited

U.S. PATENT DOCUMENTS

| | | |
|---|---|---|
| 2007/0009067 A1 | 1/2007 | Michalak |
| 2009/0080498 A1* | 3/2009 | Deisher et al. ............... 375/136 |
| 2009/0168843 A1 | 7/2009 | Waters et al. |
| 2010/0309955 A1* | 12/2010 | Jalfon et al. ............... 375/144 |
| 2011/0244821 A1 | 10/2011 | Dorsey |
| 2013/0114447 A1* | 5/2013 | Luo et al. ............... 370/252 |

* cited by examiner

ELECTRONIC DEVICE WITH DYNAMIC NOISE SPECTRUM CONTROL

BACKGROUND

This relates generally to electronic devices and, more particularly, to reducing signal interference in electronic devices such as wireless electronic devices.

Electronic devices such as cellular telephones and other devices often contain wireless communications circuitry. The wireless communications circuitry may include, for example, cellular telephone transceiver circuits for communicating with cellular telephone networks. Wireless communications circuitry in an electronic device may also include wireless local area network circuits and other wireless circuits. Antenna structures are used in transmitting and receiving wireless signals.

Electronic devices also often contain displays, cameras, and other components that use clocks and digital data. If care is not taken, a clock or digital data signal may produce radio-frequency interference that has the potential to disrupt the operation of sensitive circuitry. For example, a clock signal or data signal for a component may produce signal harmonics that fall within a wireless communications band associated with a cellular telephone transceiver or other wireless transceiver.

It would therefore be desirable to be able to provide ways to mitigate the effects of signal interference in electronic devices.

SUMMARY

An electronic device may contain clock circuits, transmitters, and other circuits that serve as sources of noise. The noise signals that are produced by these noise sources may be characterized by a noise spectrum.

The noise spectrum produced by a noise source such as a clock circuit can be adjusted by adjusting spread spectrum clock circuitry in the clock circuit. When spread spectrum clocking is enabled, the noise spectrum will be tend to be broadened (have a wider bandwidth) and will tend to be weakened. When spread spectrum clocking in the clock circuit is disabled, the noise spectrum will tend to be narrowed and strengthened. The noise spectrum produced by a transmitter will be broadened and weakened by activating data scrambling and will be narrowed and strengthened by deactivating data scrambling.

During operation of the electronic device, sensitive circuitry in the device such as wireless receiver circuitry may be adversely affected by the presence of noise from a noise source in the device. Based on information such as which receiver bands and/or channels are being actively received and based on information on target sensitivity levels for the receiver circuitry in these bands and/or channels, control circuitry within the electronic device can determine in real time how to minimize interference between the noise source and the wireless receiver circuitry.

In some operating scenarios, spread spectrum clocking and/or data scrambling may be enabled to minimize interference by broadening and weakening the noise spectrum. In other operating scenarios, spread spectrum clocking and/or data scrambling may be disabled to minimize interference by narrowing and strengthening the noise spectrum.

Further features of the invention, its nature and various advantages will be more apparent from the accompanying drawings and the following detailed description.

DETAILED DESCRIPTION

Figure 1:
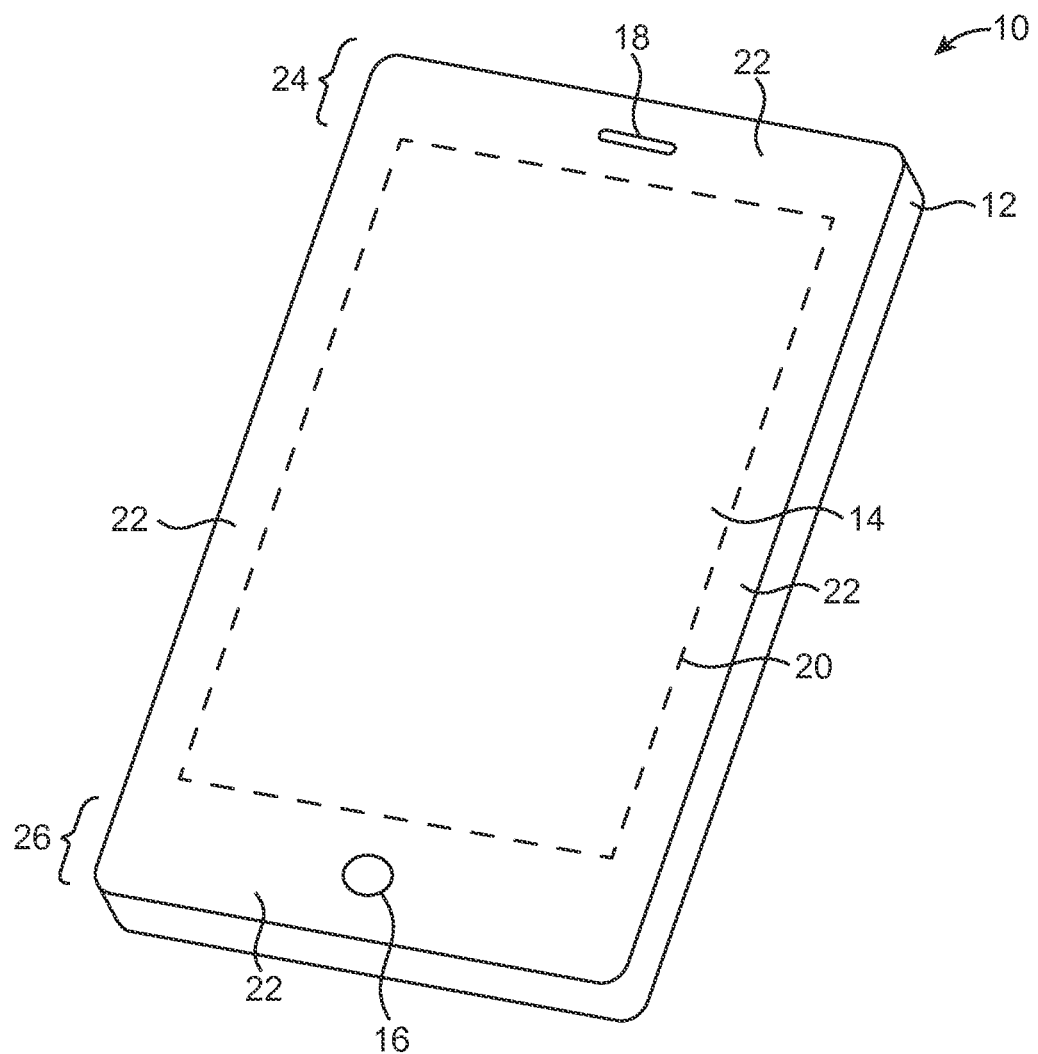
FIG. 1 is a perspective view of an illustrative electronic device with wireless circuitry in accordance with an embodiment of the present invention.

Electronic devices such as electronic device 10 of FIG. 1 may be provided with wireless communications circuitry and other circuitry that is sensitive to radio-frequency signal interference. The wireless communications circuitry may be used to support wireless communications in one or more wireless communications bands. To reduce interference with the wireless communications circuitry of device 10, device 10 may adjust the frequencies of clock signals that are used in device 10 in real time. The noise spectrum of the clock signals can also be dynamically adjusted to reduce interference. For example, device 10 may selectively activate and deactivate features in device 10 that can selectively broaden the noise spectrum produced by the clock signals such as spread spectrum clocking. Noise characteristics can also be adjusted by selectively enabling features such as data scrambling.

Device 10 of FIG. 1 may be a computer monitor with an integrated computer, a desktop computer, a television, a notebook computer, or other portable electronic equipment such as a cellular telephone, a tablet computer, a media player, a wrist-watch device, a pendant device, an earpiece device, or other compact portable device.

As shown in FIG. 1, device 10 may have a housing such as housing 12. Housing 12 may be formed from materials such as plastic, metal, carbon fiber and other fiber composites, ceramic, glass, wood, other materials, or combinations of these materials. Device 10 may be formed using a unibody construction in which some or all of housing 12 is formed from a single piece of material (e.g., a single cast or machined piece of metal, a single piece of molded plastic, etc.) or may be formed from frame structures, housing sidewall structures, and other structures that are assembled together using fasteners, adhesive, and other attachment mechanisms.

Device 10 may include components such as buttons, input-output port connectors, ports for removable media, sensors, microphones, speakers, status indicators, and other device components. As shown in FIG. 1, for example, device 10 may include buttons such as menu button 16. Device 10 may also include a speaker port such as speaker port 18 (e.g., to serve as an ear speaker for device 10).

One or more antennas may be formed in device 10. The antennas may, for example, be formed in locations such as locations 24 and 26 to provide separation from the conductive elements of display 14. Antennas may also be located at the corners of a device housing, along device housing edges, in the middle of a device housing (e.g., in the center of a rear housing wall), or elsewhere in an electronic device. The configuration of FIG. 1 is merely illustrative.

Antennas may be formed using single band and multiband antenna structures. Examples of communications bands that may be covered by the antennas include cellular telephone bands (e.g., bands from about 700 MHz to about 2200 MHz or bands at higher or lower frequencies), satellite navigation bands (e.g., the Global Positioning System band at 1575 MHz, satellite navigation bands associated with other satellite navigation systems such as GLONASS, etc.), wireless local area network bands such as the IEEE 802.11 (WiFi®) bands at 2.4 GHz and 5 GHz or the Bluetooth band at 2.4 GHz, etc. Examples of antenna configurations that may be used for the antennas in device 10 include monopole antennas, dipole antennas, strip antennas, patch antennas, inverted-F antennas, coil antennas, planar inverted-F antennas, open slot antennas, closed slot antennas, loop antennas, hybrid antennas that include antenna structures of multiple types, or other suitable antenna structures.

Device 10 may include one or more displays such as display 14. Display 14 may be a liquid crystal display (LCD), an organic light-emitting diode (OLED) display, a plasma display, an electrowetting display, an electrophoretic display, or a display using other display technologies. A touch sensor may be incorporated into display 14 (i.e., display 14 may be a touch screen). The touch sensor may be an acoustic touch sensor, a resistive touch sensor, a piezoelectric touch sensor, a capacitive touch sensor (e.g., a touch sensor based on an array of indium tin oxide capacitor electrodes), or a touch sensor based on other touch technologies.

Display 14 may be covered by a transparent planar conductive member such as a layer of glass or plastic. The cover layer may extend over substantially all of the front face of device 10 (as an example). The rectangular center portion of the cover glass (surrounded by dashed line 20 in FIG. 1) contains an array of image pixels and is sometimes referred to as the active portion of display 20. The active portion of display 14 may extend to the edges of device housing 12 (e.g., in a borderless display design) or peripheral border portion 22 of display 14 may form an inactive region without underlying active pixels.

Figure 2:
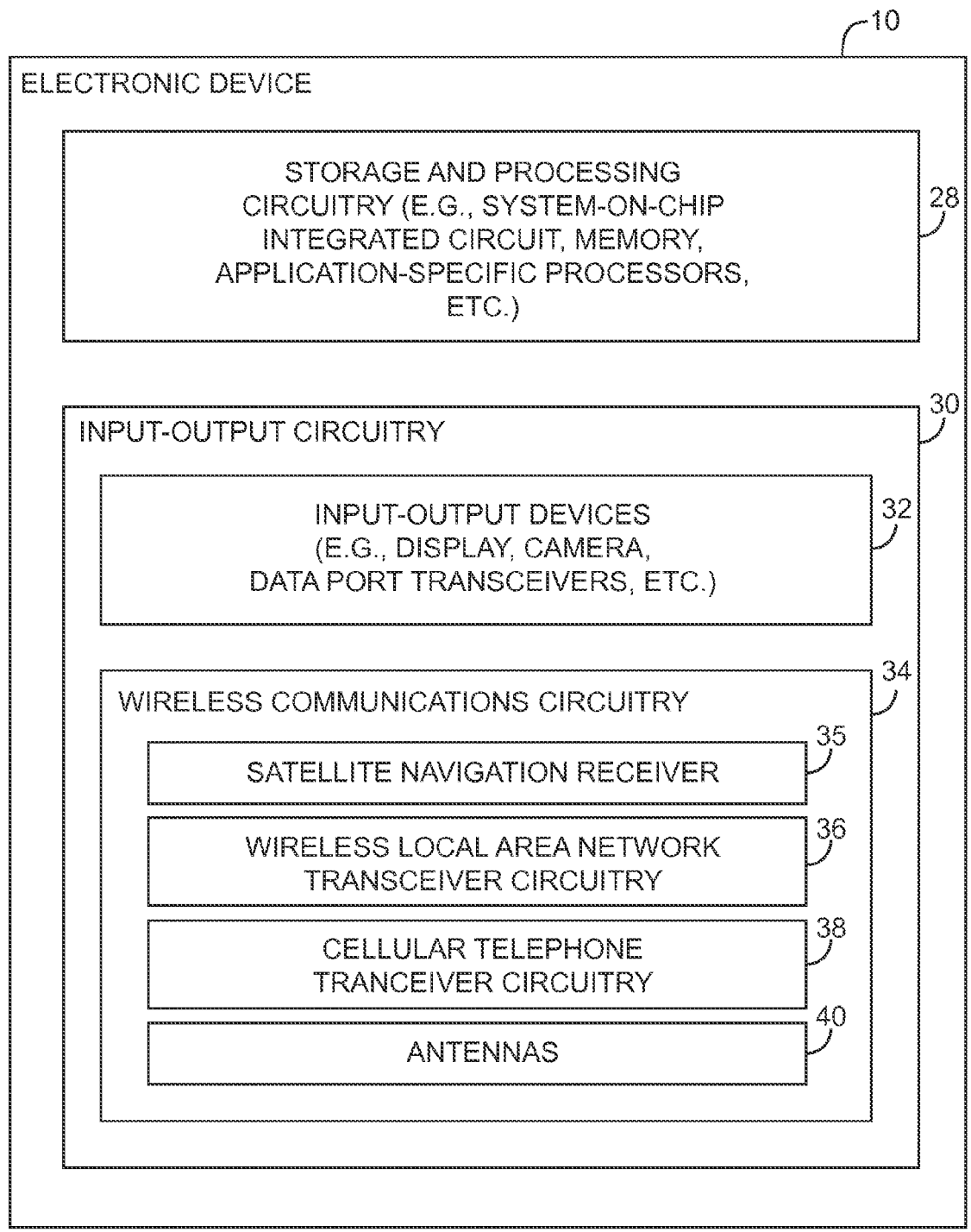
FIG. 2 is a diagram of illustrative circuitry that may be used in an electronic device in accordance with an embodiment of the present invention.

A schematic diagram of electronic device 10 is shown in FIG. 2. As shown in FIG. 2, electronic device 10 may include control circuitry such as storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more system on chip (SoC) integrated circuits, microprocessors, microcontrollers, digital signal processors, baseband processors, power management units, audio codec chips, application specific integrated circuits, memory controllers, timing controllers, etc.

Storage and processing circuitry 28 may be used to run software on device 10, such as internet browsing applications, voice-over-internet-protocol (VoIP) telephone call applications, email applications, media playback applications, operating system functions, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, etc.

Circuitry 28 may be configured to implement control algorithms that control the use of clock circuitry in device 10. For example, circuitry 28 may be configured to implement a control algorithm that adjusts the frequencies used by one or more clocks in device 10 in real time to avoid generating radio-frequency interference for wireless circuitry in device 10. Circuitry 28 may also be configured to control whether noise spectrum adjustment features such as spread spectrum clocking and data scrambling are active or inactive. Decisions on whether to use noise spreading features to adjust the noise spectrum produced by clock and data signals may be made in real time based on which wireless frequencies are being used by device (i.e., which communications bands and/or channels are being actively received by the receiver circuitry of device 10). Information on other noise sources (i.e., sources such as radio-frequency wireless transmitters which may produce signals that mix with clock and data noise signals) may also be used in dynamically making noise spectrum spreading adjustments to minimize interference.

Input-output circuitry 30 may be used to allow data to be supplied to device 10 and to allow data to be provided from device 10 to external devices. Input-output circuitry 30 may include input-output devices 32. Input-output devices 32 may include touch screens, buttons, joysticks, click wheels, scrolling wheels, touch pads, key pads, keyboards, microphones, speakers, tone generators, vibrators, cameras, sensors, light-emitting diodes and other status indicators, transceiver circuits associated with data ports, etc. A user can control the operation of device 10 by supplying commands through input-output devices 32 and may receive status information and other output from device 10 using the output resources of input-output devices 32.

Wireless communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Wireless communications circuitry 34 may include satellite navigation system receiver circuitry 35 such as Global Positioning System (GPS) receiver circuitry operating at 1575 MHz and/or receiver circuitry using the Global Navigation System (GLONASS). Wireless local area network transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as bands at about 700 MHz to about 2200 MHz or other cellular telephone bands of interest. Wireless communications circuitry 34 can include circuitry for other short-range and long-range wireless links if desired. For example, wireless communications circuitry 34 may include wireless circuitry for receiving radio and television signals, paging circuits, near field communications circuitry, 60 GHz communications circuitry, etc. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include antennas 40. Antennas 40 may be formed using any suitable antenna types. For example, antennas 40 may include antennas with resonating elements that are formed from loop antenna structure, patch antenna structures, inverted-F antenna structures, closed and open slot antenna structures, planar inverted-F antenna structures, helical antenna structures, strip antennas, monopoles, dipoles, hybrids of these designs, etc. Different types of antennas may be used for different bands and combinations of bands. For example, one type of antenna may be used in forming a local wireless link antenna and another type of antenna may be used in forming a remote wireless link.

The circuitry of device 10 may include clocks, digital data transmitter circuits, and other circuits that are potential sources of radio-frequency interference. These sources can produce interference signals at fundamental frequencies (e.g., clock signal fundamentals), harmonic frequencies (e.g., integer harmonics of fundamental frequencies), and mixing products (e.g., interference signals at sum and difference frequencies that are created when clock fundamentals, clock harmonics, and other interference signals mix within the circuitry of device 10). These interference signals are sometimes referred to as aggressors.

The circuitry of device 10 may also include circuitry that is sensitive to interference such as wireless communications circuitry 34. Wireless communications circuitry 34 may include receiver circuitry that operates in one or more communications bands. Circuitry 34 may be vulnerable to interference at in these bands or channels within these bands. The frequencies at which circuitry 34 is vulnerable to interference may sometimes be referred to as victims.

As an example, device 10 may a radio-frequency receiver that operates in a communications band at frequency ff. Device 10 may also include a clock generates signals that lie within the band at frequency ff. It may not be practical to perfectly shield the signal lines that carry the signals at frequency ff from the antennas and other radio-frequency circuitry associated with the radio-frequency receiver that is operating at frequency ff. As a result, the aggressor in this example (i.e., the clock at frequency ff) may produce interference signals that disrupt the operation of the victim (i.e., the receiver operating at frequency ff).

Undesirable signal interference during operation of device 10 may be reduced or eliminated by adjusting clocks and other circuits to avoid collisions between aggressor frequencies and victim frequencies. For example, the clock frequencies in device 10 can be adjusted in real time to reduce interference with wireless circuitry 34. If, as an example, device 10 is using wireless circuitry 34 to receive signals at frequency ff, a clock that nominally operates at frequency ff can be adjusted to operate at a different clock frequency ff' that does not adversely affect the operation of wireless circuitry 34 (e.g., a frequency ff' that does not lie within the communications band at frequency ff).

Device 10 may also include circuitry such as spread spectrum clocking circuitry and data scrambling circuitry that can be used to alter the noise spectrum produced by an aggressor in real time to mitigate interference.

Figure 3:
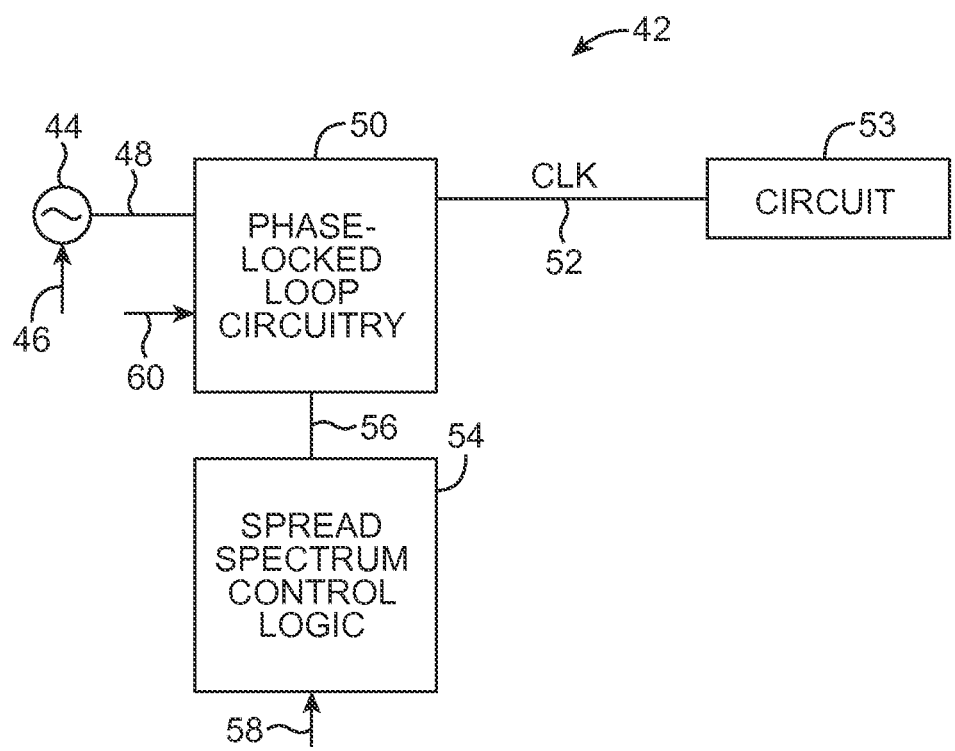
FIG. 3 is a diagram of an illustrative clock circuit with adjustable spread spectrum capabilities in accordance with an embodiment of the present invention.

FIG. 3 is a circuit diagram of illustrative clock circuitry that may be used in device 10. There may be one or more clock circuits such as clock circuitry 42 of FIG. 3 or other suitable clock circuits in device 10. Clock circuitry 42 may produce a clock signal CLK that is used in clocking circuitry on device 10 such as circuit 53. Device 10 may include one or more integrated circuits that contain clock circuitry 42 and/or that are used in implementing circuit 53. These integrated circuits may include processors, display driver circuits, image sensor integrated circuits, data transceiver circuits, memory circuits, and other components.

As an example, clock circuitry 42 may be included in a processor such as a system-on-chip processor and circuit 53 may be a display driver integrated circuit in a display, a circuit in a component such as a camera (e.g., an image sensor integrated circuit), a memory integrated circuit, a timing control circuit, or a data port transceiver (as examples). Circuits such as display driver integrated circuits, image sensor integrated circuits, and other circuits in device 10 may also include clock circuitry such as clock circuitry 42 if desired.

As shown in FIG. 3, clock circuitry 42 may use signals from an oscillator circuit such as oscillator 44. Oscillator 44 may produce an alternating current (AC) signal at output path 48. Phase-locked loop 50 may receive the AC signal on path 48 as an input and may produce a corresponding output clock signal CLK on output 52. The output signal CLK may serve as a clock for downstream circuits. There is generally an integer relationship between the frequency of CLK and the frequency of the signal received on path 48. The frequency of signal CLK may be adjusted by adjusting oscillator 44 and/or phase-locked loop circuitry 50. For example, control signals may be applied to control input 46 of oscillator 44 to adjust the frequency of oscillator 44 and thereby adjust the frequency of signal CLK and/or control signals may be applied to control input 60 of phase-locked loop 50 to control the frequency of signal CLK.

Clock circuitry 42 may also include spread spectrum clocking circuitry such as spread spectrum control logic 54. Control logic 54 may receive a spread spectrum enable signal using control input 58. When the spread spectrum enable signal is deasserted, spread spectrum control logic 54 may be deactivated so that phase-locked loop circuitry 50 produces signal CLK at clock output 52 at a single fundamental frequency. When the spread spectrum enable signal is asserted, spread spectrum control logic 54 may produce a time-varying frequency modulation control signal on path 56. This frequency modulation control signal may modulate the frequency of signal CLK to spread out (broaden and weaken) the noise spectrum produced by signal CLK.

Figure 4:
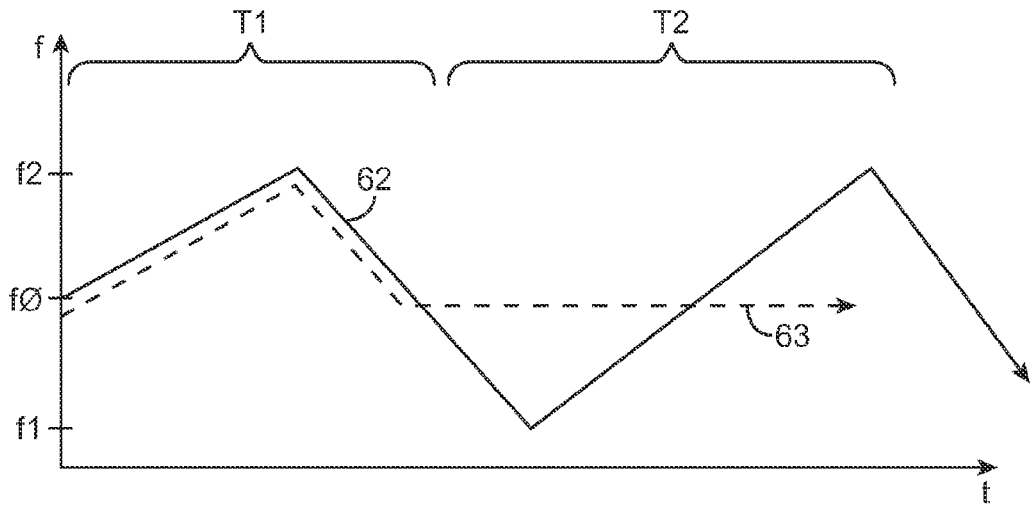
FIG. 4 is a graph showing how a clock frequency may be modulated when using spread spectrum clocking in accordance with an embodiment of the present invention.

An illustrative frequency modulation control signal that may be provided to phase-locked loop circuitry 50 is a triangular wave. Other types of modulation signal may be used if desired. FIG. 4 is a graph in which the time-varying frequency f of signal CLK at output 52 has been plotted as a function of time t. As shown by curve 62, clock signal CLK may be characterized by a fundamental frequency f0 (i.e., the frequency of signal CLK in the absence of spread spectrum modulation). When spread spectrum modulation is activated, the frequency f of signal CLK may vary continuously as a function of time between minimum frequency f2 and maximum frequency f1.

Clock signal CLK may have any suitable frequency such as 100 MHz, less than 100 MHz, more than 100 MHz, 200 MHz, less than 200 MHz, more than 200 MHz, 500 MHz, less than 500 MHz, more than 500 MHz, 1 GHz, less than 1 GHz, more than 1 GHz, 100 MHz to 200 MHz, 200 MHz to 1 GHz, 400 MHz to 1 GHz, etc. The modulation frequency of the modulation signal on path 56 may have a frequency of 30 kHz, less than 30 kHz, more than 30 kHz, or other suitable frequency. The fundamental frequency f0 of clock signal CLK may be modulated +/−0.1%, +/−0.5%, +/−less than 0.1%, +/−more than 0.1%, +/−less than 0.5%, +/−more than 0.5%, +/−1%, +/−less than 1%, +/−more than 1%, +/−20%, +/−less than 20%, +/−more than 20%, or any other suitable amount.

Another way in which to broaden the noise spectrum produced by an aggressor in device 10 involves the use of data scrambling. When unscrambled digital data at a given bit rate is conveyed over a signal path in device 10, the data may produce noise centered at a frequency associated with the bit rate (e.g., a frequency f0). By encoding the digital data using a scrambling function such as a scrambling function based on pseudo-random bit sequences (PRBS), the amount of noise that the data produces at frequency f0 may be decreased (i.e., the noise spectrum associated with conveying the data signals may be spread out in frequency as when using spread spectrum clocking).

Device 10 may use control circuitry 28 (FIG. 2) to control whether data scrambling operations are active or inactive. Device 10 may, for example, contain circuitry such as circuitry 64 of FIG. 5. Circuitry 64 may include a transmitter circuit such as transmitter circuit 70 and a corresponding receiver circuit such as receiver circuit 76. Transmitter circuit 70 and receiver 76 may each be formed as part of a respective integrated circuit or other components. Examples of components that may include transmitter circuitry such as transmitter circuit 70 and receiver circuitry such as receiver circuit 76 include processors (e.g., a system-on-chip integrated circuit, microprocessor, or other processor), application-specific integrated circuits (e.g., a camera circuit, a display circuit, a data port circuit), and memory circuits.

As an example, transmitter circuit 70 may be formed as part of a system-on-chip processor circuit and receiver circuit 76 may be formed as part of a display driver integrated circuit for a display. As another example, transmitter circuit 70 may be formed as part of a camera image sensor circuit and receiver circuit 76 may be formed as part of a processor circuit. If desired, transmitter 70 may be associated with a processor and receiver 76 may be formed as part of a memory interface for a memory circuit. These are merely illustrative examples. In general, transmitter circuit 70 and receiver circuit 76 may be associated with any suitable circuitry in device 10.

Figure 5:
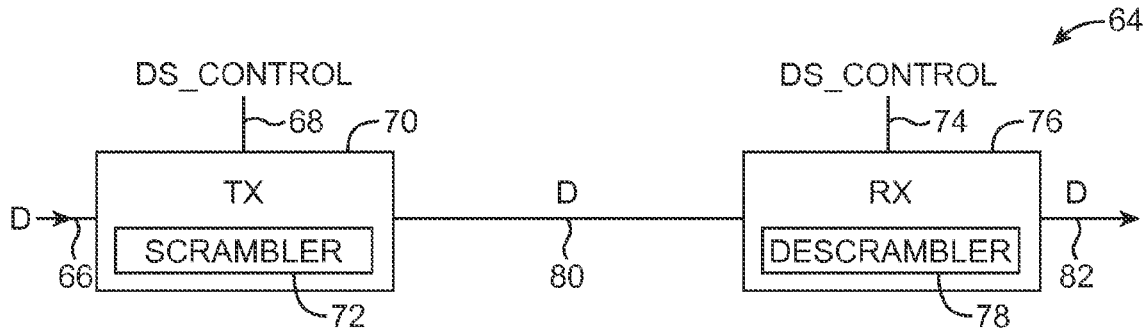
FIG. 5 is a diagram of a data transmitter and data receiver with deactivated data scrambler circuitry and data descrambler circuitry in accordance with an embodiment of the present invention.

As shown in FIG. 5, transmitter 70 may have an associated data scrambler circuit such as data scrambler 72. Receiver circuit 76 may have a corresponding data descrambler circuit such as data descrambler 78. Data scrambler 72 may be activated and deactivated in response to assertion and deassertion of a data scrambling control signal DS_CONTROL on path 68. In receiver circuit 76, data descrambler 78 may be activated and deactivated by respectively asserting or deasserting data scrambling control signal DS_CONTROL on path 74.

Data may be conveyed between transmitter circuit 70 and receiver circuit 76 over data path 80. Data path 80 may be a digital signal bus containing one or more conductive lines. When implemented in device 10, path 80 may pass over one or more printed circuits or other structures (cables, wires, portions of a ground plane formed from traces on a printed circuit or conductive housing structures, etc.). Path 80 may give rise to a potential for the data signals to produce radio-frequency interference for victims in device 10.

The noise spectrum of the noise produced by the data signals traveling over path 80 may be controlled in real time to reduce interference. In particular, device 10 may use control circuitry 28 to selectively activate or deactivate data scrambling functions to control the noise spectrum produced by the transmitted data on path 80.

In the illustrative configuration of FIG. 5, data scrambling functions have been deactivated by deasserting control signals DS-CONTROL on inputs 68 and 74. As a result, data D that is provided to input 66 of transmitter circuit 70 is conveyed in unscrambled form (D) over path 80. Scrambler 72 and descrambler 78 are deactivated in this situation. Receiver circuit 76 receives the unscrambled data signals on path 80 and supplies corresponding data signal D at output 82. Because data scrambling is off in the configuration of FIG. 5, the noise spectrum associated with the transmission of data from transmitter 70 to receiver 64 may be relatively narrow and strong and may be peaked around a particular frequency (e.g., frequency f0).

Figure 6:
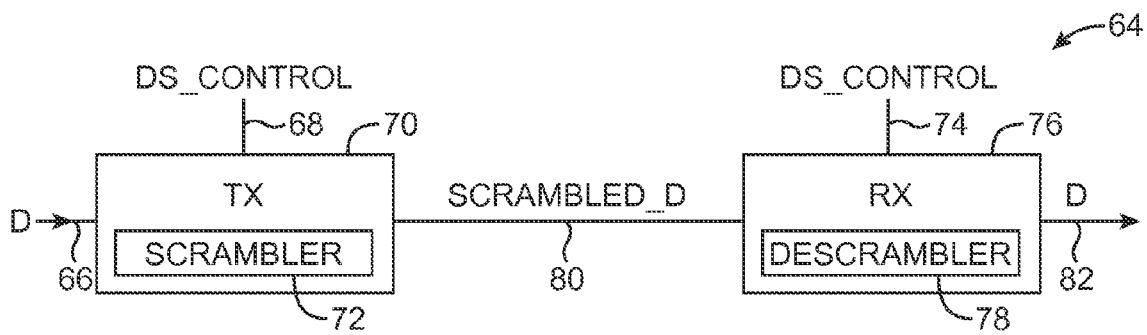
FIG. 6 is a diagram of a data transmitter with activated data scrambler and data descrambler circuitry in accordance with an embodiment of the present invention.

In the illustrative configuration of FIG. 6, data scrambling functions have been activated by asserting control signal DS_CONTROL on inputs 68 and 74. Scrambler 72 and descrambler 78 are therefore activated, so that data D that is provided to input 66 of transmitter circuit 70 is conveyed in scrambled form (SCRAMBLED_D) over path 80. Receiver circuit 76 receives the scrambled data signals on path 80 and descrambles the scrambled data signals to produce unscrambled data D on output 82. Because data scrambling is on in the configuration of FIG. 6, the noise spectrum associated with the transmission of data from transmitter 70 to receiver 64 may be broadened and weakened relative to the noise spectrum associated with transmission of the unscrambled data in the configuration of FIG. 5.

Figure 7:
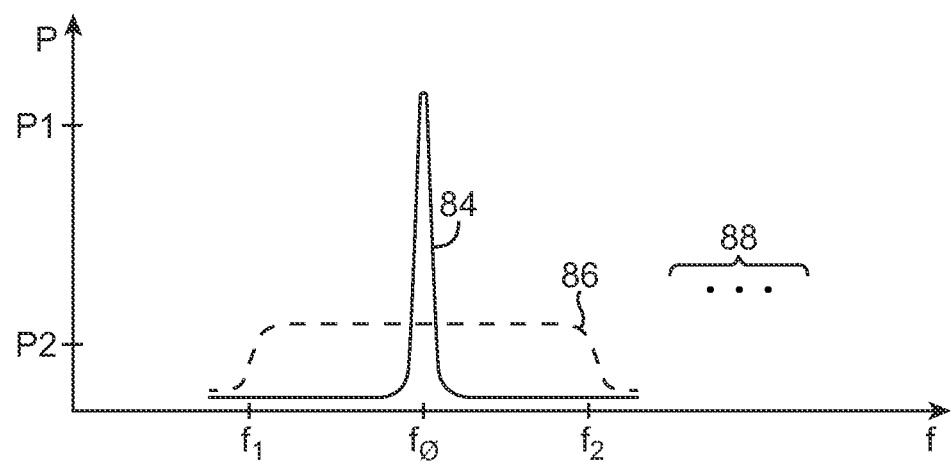
FIG. 7 is a graph of an illustrative signal interference spectrum that may be generated in the presence and absence of features such as spread spectrum clocking and data scrambling in accordance with an embodiment of the present invention.

FIG. 7 is a graph showing how the noise spectrum associated with transmission of a clock signal or data signal can be adjusted in real time in device 10. In FIG. 7, noise strength P has been plotted as a function of frequency f. Curve 84 corresponds to a relatively narrow and strong noise spectrum of the type that is associated with transmission of clock CLK using circuit 42 without spread spectrum clocking and that is associated with transmission of unscrambled data using transmitter 70 while scrambler 72 is inactive. Curve 86 corresponds to a broader and weaker noise spectrum of the type that is associated with transmission of clock CLK using when circuit 42 has been directed to employ spread spectrum clocking and that is associated with transmission of scrambled data using transmitter 70 while scrambler 72 is active.

Narrow (undistributed) noise spectrum 84 may be concentrated in a peak around frequency f0, whereas broadened noise spectrum 86 may be distributed sufficiently to cover an expanded frequency range from f1 to f2. Because the distributed noise spectrum covers a wider rand of frequencies, the peak signal strength P2 that is associated with distributed noise spectrum 86 is less than the peak signal strength P1 that is associated with narrow noise spectrum 84. As indicated by dots 88, narrow noise spectrum 84 and distributed noise spectrum 86 may exhibit harmonics (e.g., signals at frequencies that are integer multiples of the signal frequencies associated with spectrums 84 and 86). Non-linear effects may also lead to the production of mixing products associated with the sum and differences between these interference signals.

Figure 8:
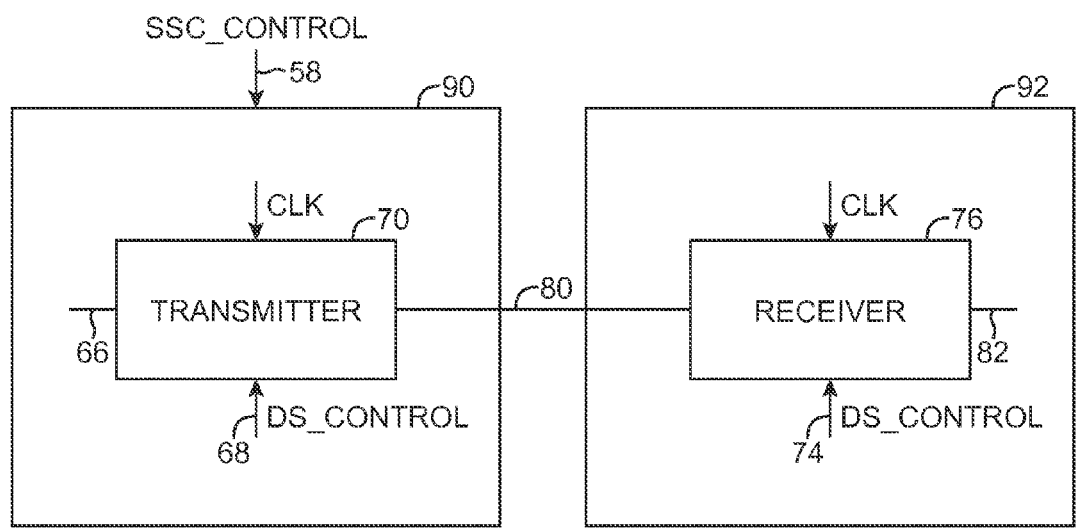
FIG. 8 is a diagram showing how components in an electronic device may be provided with dynamically adjustable spread spectrum clocking and data scrambling capabilities in accordance with an embodiment of the present invention.

FIG. 8 shows how components such as components 90 and 92 may be provided with circuitry such as transmitter circuit 70 and receiver circuit 76. Component 90 and/or component 92 may be, for example, a system-on-chip processor, a microprocessor, a microcontroller, an application specific integrated circuit, a display with a display driver integrated circuit, a camera with a camera circuit, a memory circuit, a timing control circuit, a data transceiver, or any other suitable component. As an example, component 90 may be a system on chip integrated circuit and component 92 may be a display driver in a display, a timing control circuit, an image sensor integrated circuit, a memory circuit, or a data transceiver circuit (as examples). As another example, component 90 may be an image sensor, data transceiver, memory circuit, or other circuit, and component 92 may be a system on chip processor or other processor.

Component 90 may include (or may receive signals from) clock circuitry such as clock circuitry 42 of FIG. 3 that has a spread spectrum clocking feature that may be selectively enabled and disabled using control signals on control input 58 and may include a scrambler such as scrambler 72 of FIG. 5 that may be selectively enabled and disabled using control signals on control input 68. If desired, clock circuitry 42 may be implemented using circuitry that is external to component 90 (e.g., an external oscillator and/or external phase-locked loop, spread spectrum control logic, etc.). Component 92 may receive the clock from clock circuitry 42 or may recover an embedded clock from the data stream provided over path 80. Component 92 may include a descrambler such as descrambler 78 of FIG. 5 that may be selectively enabled (i.e., enabled and disabled in real time) using dynamic control signals on control input 74.

When spread spectrum clocking and/or data scrambling are enabled, the noise produced by the circuitry of FIG. 8 may be characterized by a relatively broad and weak noise spectrum such as distributed noise spectrum 86 of FIG. 7. When spread spectrum clocking and data scrambling are disabled, the noise produced by the circuitry of FIG. 8 may be characterized by a narrower and stronger noise spectrum such as narrow noise spectrum 84 of FIG. 7.

In some circumstances, it may be advantageous to employ one or more techniques for spreading the noise spectrum in device 10, but in other circumstances it may be preferable to disable noise spectrum spreading. During testing and calibration of device 10, device 10 can be characterized to determine the behavior of victims in device 10 in a variety of operating scenarios. During operation, device 10 can gather information on the present state of the victims and aggressors in device 10 and, using previously gathered characterization data, can determine how best to configure circuitry in device 10 such as the transmitter and receiver circuits of FIG. 8 to ensure optimum victim performance.

Figure 9:
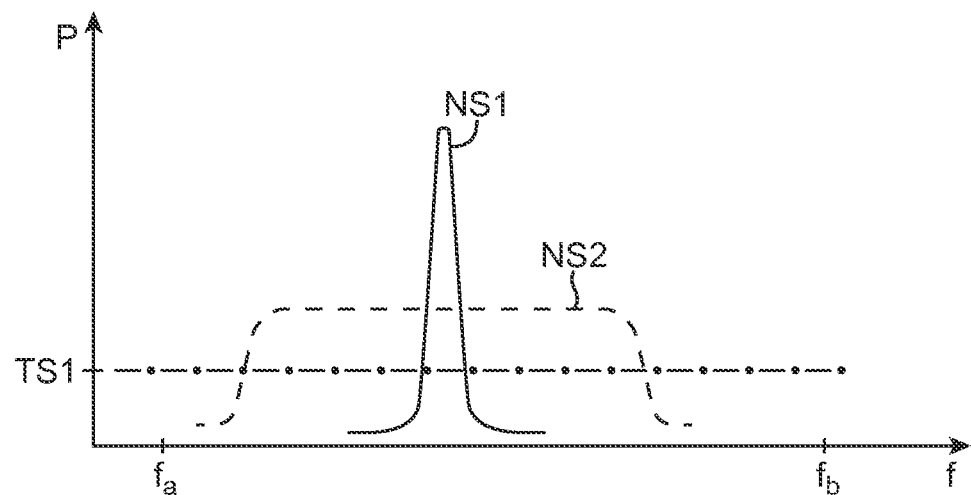
FIGS. 9 and 10 are graphs comparing illustrative target wireless receiver sensitivity levels with a signal noise spectrum in the presence and absence of features such as spread spectrum clocking and data scrambling in accordance with an embodiment of the present invention.

Consider, as an example, the scenario of FIG. 9. In this scenario, device 10 is operating in a communications band between frequency fa and frequency fb (i.e., the victim in this scenario is a receiver in wireless circuitry 32 that is operating in the band from fa to fb). In this communications band, the wireless receiver has a target sensitivity level of TS1. The target receiver sensitivity level may be established based on carrier requirements and/or requirements established by a manufacturer of device 10 or other parties. The target receiver sensitivity level TS1 represents a minimum acceptable performance level for device 10 when operating in the band from fa to fb.

In the absence of noise spreading (i.e., in the absence of spread spectrum clocking and the absence of data scrambling), device 10 may be characterized by a noise spectrum such as NS1 of FIG. 9. When noise spreading is activated (i.e., by enabling spread spectrum clocking and/or enabling data scrambling), device 10 may be characterized by a distributed noise spectrum such as NS2 of FIG. 9. As shown in FIG. 9, distributed noise spectrum NS2 exhibits noise over much of the communications band between frequencies fa and fb.

Noise NS2 exceeds target receiver sensitivity level TS1. As a result, it would be more advantageous for device 10 to produce noise spectrum NS1 than noise spectrum NS2. When operating in the presence of noise spectrum NS1, a relatively small portion of the communications band from fa to fb will be impaired. If, however, device 10 is operated in this communications band in the presence of noise spectrum NS2, a relatively large portion of the communications band will be impaired.

Figure 10:
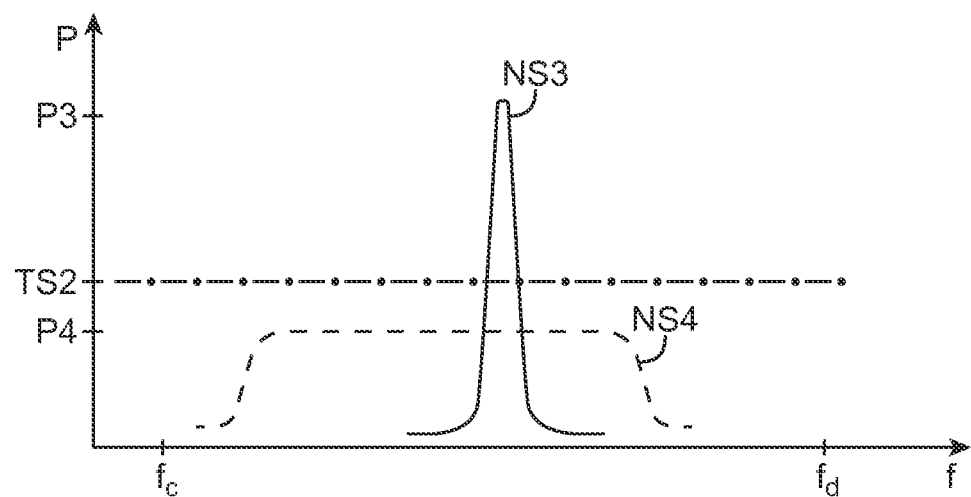

The situation in the illustrative scenario of FIG. 10 is different. In the scenario of FIG. 10, device 10 is operating in a communications band between frequency fc and frequency fd (i.e., the victim in this scenario is a receiver in wireless circuitry 32 that is operating in the band from fc to fd). In this communications band, the wireless receiver has a target sensitivity level of TS2 (which may be different than target sensitivity level TS1).

In the absence of noise spreading (i.e., in the absence of spread spectrum clocking and the absence of data scrambling), device 10 may be characterized by a noise spectrum such as NS3. When noise spreading is activated (i.e., by enabling spread spectrum clocking and/or enabling data scrambling), device 10 may be characterized by a distributed noise spectrum such as NS4.

As shown in FIG. 10, distributed noise spectrum NS4 exhibits noise over a larger range of the communications band between frequencies fa and fb than noise spectrum NS3. Nevertheless, the reduction in the magnitude of the noise signals associated with spectrum NS4 relative to NS3 (i.e., the reduction in noise signal strength from P3 to P4), ensures that the noise of noise spectrum NS4 does not exceed target receiver sensitivity level TS2. As a result, it is more advantageous for device 10 to produce noise spectrum NS4 than noise spectrum NS1 when operating in the communications band at frequencies of fc to fd. When operating in the presence of noise spectrum NS3, the central portion of the communications band from fc to fd will be impaired, but when operating in the presence of noise spectrum N34, all noise falls below the target sensitivity level TS2 of the receiver in device 10 and is therefore not detected by the receiver and does not adversely affect receiver performance.

During testing, device 10 (or representative circuitry) can be characterized to measure the noise spectrums and resulting victim performance impact (exceeding or not exceeding target sensitivity levels) that result from all desired operating conditions for device 10 (i.e., for all desired individual and simultaneous wireless transmitter bands, all desired individual and simultaneous receiver bands, all desired clock frequencies, all desired digital data rates within the communications paths in device 10, etc.). After characterizing device 10, a look-up table or other data structure may be programmed into device 10 to instruct device 10 on how to respond in each different operating scenario. During use of device 10 in a system, device 10 can use the look-up table or other predetermined information to ensure that device 10 selectively enables (i.e., activates and deactivates) noise spectrum spreading functions so as to minimize interference between the aggressors (i.e., the clocks, data transmitters, or other noise sources) and the currently active victims (i.e., operating receiver circuitry).

Figure 11:
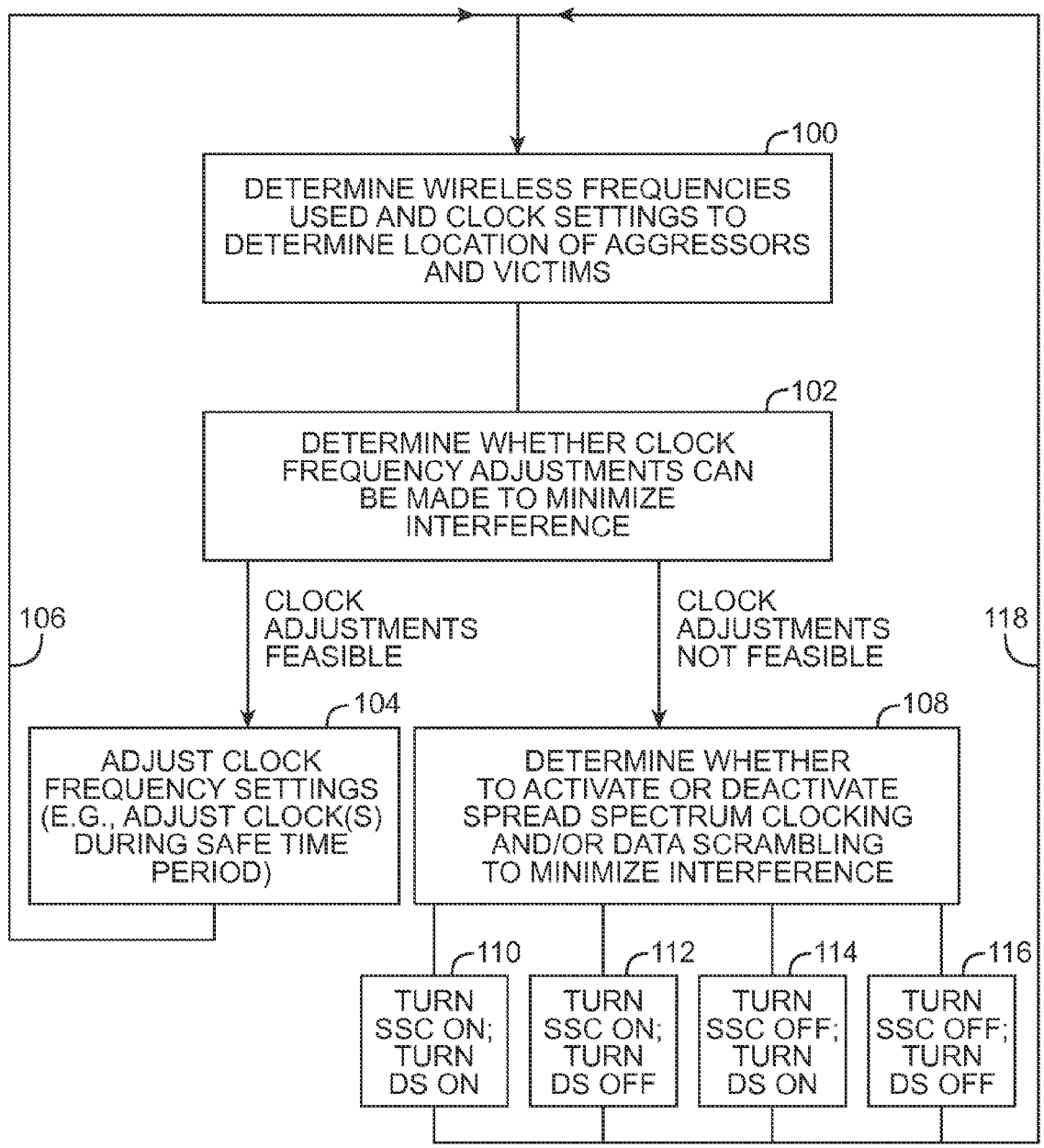
FIG. 11 is a flow chart of illustrative operations involved in dynamically controlling features such as clock frequency, spread spectrum clocking, and data scrambling to minimize interference in a wireless electronic device in accordance with an embodiment of the present invention.

A flow chart of illustrative steps involved in operating device 10 in a wireless network while selectively enabling and disabling noise spectrum spreading features in real time to minimize radio-frequency interference in device 10 is shown in FIG. 11.

At step 100, device 10 may use control circuitry such as storage and processing circuitry 28 to determine the locations of aggressors and victims that are being used in device 10. For example, wireless circuitry in device 10 may contain receivers that are sensitive to radio-frequency interference. The receivers may include, for example, cellular telephone receivers, wireless local area network receivers, Bluetooth® receivers, IEEE 802.11 receivers, satellite navigation system receivers, near field communications (NFC) receivers, and other receivers. These receivers may have the capability to operate in multiple communications bands. In general, device 10 will use a subset of the communications bands available at any given point in time. For example, device 10 will typically use a subset of the available cellular telephone communications bands, etc. Based on knowledge of which communications bands and/or which communications channels within the communications bands are currently being actively used by the receiver circuitry in device 10, device 10 can identify victim frequencies in device 10. As one example, device 10 may ascertain that wireless signals are being received in a communications band at 2.4 GHz (e.g., in a particular IEEE 802.11 channel), that wireless signals are being received in a cellular telephone band at 700 MHz, and that satellite navigation system signals are being received at 1575 MHz. In this situation, the victim frequencies can be identified by active receiver band and/or by active receiver channel.

In addition to identifying the location of victim frequencies, device 10 may use control circuitry such as storage and processing circuitry 28 to determine the current locations of aggressors. For example, device 10 can determine the settings for clocks (e.g., fixed and/or adjustable clocks), the settings for wired and wireless transmitters, and other sources of potential interference in device 10. A clock or other such source of interference may generate interference at a fundamental frequency (i.e., the clock's operating frequency) and at one or more harmonic frequencies. Aggressors may also be associated with mixing products (e.g., sum and difference frequencies associated with active aggressors).

During the operations of step 102, device 10 may use control circuitry to determine whether clock frequency adjustments (e.g., transmitter clock frequency adjustments affecting data transmission rates or clock frequency adjustments affecting other functions) may be used to minimize interference. Device 10 may, for example, determine whether it would be possible to adjust a clock's frequency sufficiently to avoid collisions between the aggressors and victims while ensuring that the components that use the clock signal will operate properly. Device 10 may use a look-up table containing information that has been gathered during device characterization operations. The look-up table (or other suitable data structure) may, for example, include information on the amount of interference that is produced at each active victim frequency (i.e., the amount of noise produced at each active receiver communications band and/or channel compared to the receiver's target sensitivity level) as a function of which aggressor frequencies are used (i.e., which clock frequencies are active). The look-up table (or other data structure or information stored in storage and processing circuitry 28) may include information on the maximum amount of clock tuning that is available for each clock.

In response to determining that one or more clock signal frequency adjustments may be made to reduce interference in device 10, device 10 may, at step 104 make the appropriate clock frequency adjustments. For example, the frequency of operation of one or more clocks may be increased and/or decreased. If, as an example, a clock is currently operating at frequency fr1 and a harmonic at 3fr1 falls within a cellular telephone receive band, the clock may be adjusted so that the clock operates at a frequency of fr1-Δf. In this situation, the harmonic (3fr1-3 Δf) may fall outside of the cellular telephone receive band, thereby minimizing radio-frequency interference. As another example, if device 10 determines that two clocks are operating or that a clock and a particular wired or wireless transmitter are operating that generate mixing products that create interference for a particular victim, clock frequency adjustments may be made to ensure that the victim is no longer significantly affected by the interference. In general, any type of clock frequency adjustment may be made such as clock frequency increases, clock frequency decreases, and adjustments that involve increasing one or more clock frequencies while simultaneously lowering one or more other clock frequencies. Adjustments may also be made to the frequencies associated with other (non-clock) aggressors, if desired.

Device 10 may make the clock frequency adjustments of step 104 during times that will minimize disruption to the operation of components that are using the adjusted clocks. For example, adjustments to a display clock may be made during a display blanking interval, adjustments to an image sensor clock may be made during a period in which the clock adjustment will not affect the capture of image data with the sensor, etc.

After device 10 has made the clock adjustments and other aggressor frequency adjustments of step 104, processing may loop back to step 100, as indicated by line 106.

In response to determining at step 102 that it is not feasible to make clock frequency adjustments to reduce radio-frequency interference between the aggressors and victims in device 10 (e.g., because those adjustments are not available or because those adjustments have already been made as best possible), device 10 may, at step 108, determine whether aggressor spectrum modifications may be made to minimize interference and may determine how best to make aggressor spectrum modifications. Examples of aggressor frequency spectrum modification features that may be used in device 10 include spread spectrum clocking and data scrambling.

As described in connection with FIGS. 9 and 10, deployment of spectrum modification features will minimize interference in some operating conditions. In other operating conditions, interference will be minimized by not deploying spectrum modification features. Moreover, different spectrum modification features will generally modify aggressor frequency spectrums differently (i.e., the frequency spread resulting from use of spread spectrum clocking will differ from the frequency spread resulting from use of data scrambling and yet another frequency spectrum will be produced when employing both spread spectrum clocking and data scrambling together).

During the operations of step 108, the control circuitry of device 10 may use a look-up table or other data structure that contains information that has been gathered during device characterization operations. The look-up table (or other suitable data structure) may, for example, include information on the amount of interference that is produced at each active victim frequency (i.e., the amount of noise produced at each active receiver communications band and/or channel compared to the receiver's target sensitivity level) as a function of which aggressor frequencies are used (i.e., which clock frequencies are active) and as a function of which noise spectrum modification features are active or inactive (e.g., as a function of whether spread spectrum clocking and/or data scrambling is in use).

If, during the operations of step 108, it is determined that optimum results will be obtained by using spread spectrum clocking and using data scrambling, device 10 may use control circuitry such as a storage and processing circuitry 28 to turn spread spectrum clocking on while simultaneously turning on data scrambling to minimize interference at step 110.

If, during the operations of step 108, it is determined that optimum results will be obtained by using spread spectrum clocking without using data scrambling, device 10 may use control circuitry such as a storage and processing circuitry 28 to activate spread spectrum clocking on while deactivating data scrambling to minimize interference at step 112.

In response to determining, during the operations of step 108, that interference will be minimized by forgoing the use of spread spectrum clocking while using data scrambling, device 10 may use control circuitry such as a storage and processing circuitry 28 to activate data scrambling while deactivating spread spectrum clocking (step 114).

Spread spectrum clocking and data scrambling can both be deactivated (step 116) in response to a determination during the operations of step 108 that interference will be minimized by using neither spread-spectrum clocking nor data scrambling.

When deactivating and activating spread spectrum clocking, it may be desirable to avoid sharp discontinuities in the frequency of the clock. For example, device 10 may control the clock modulation of a clock so that the output frequency f follows dashed line 63 of FIG. 4 when transitioning from use of a spread spectrum modulation scheme during time period T1 to use of an unmodulated clock during time period T2. With this type of transition between active and inactive spread spectrum clocking modes, the clock frequency f is allowed to return to nominal frequency f0 as part of the modulation process before spread spectrum clocking is turned off. Because spread spectrum clocking is deactivated when f has already reached f0, there is not a sharp discontinuity associated with turning off spread spectrum clocking. Other types of spread spectrum clocking mode transitions may be used if desired. Moreover, spread spectrum clocking mode transitions (enabled/disabled) and data scrambling mode transitions (enabled/disabled) may, if desired be made during times that will minimize disruption to the operation of components in device 10. For example, spread spectrum clocking and/or data scrambling may be enabled and disabled during a display blanking interval or other safe time period (e.g., a period in which the clock adjustment or data transmission mode change will not affect the capture of image data with the sensor, a period in which the mode change will not adversely affect the transmission of data between circuits, etc.).

As shown by line 118, following desired selective activation of aggressor noise spectrum spreading functions, processing may loop back to the operations of step 100. The operations of FIG. 11 may be performed continuously in real time during the operation of device 10. By dynamically adjusting clock frequencies and/or selectively deploying aggressor spectrum spreading functions such as spread spectrum clocking and data scrambling, interference between aggressors and victims in device 10 can be minimized.

The foregoing is merely illustrative of the principles of this invention and various modifications can be made by those skilled in the art without departing from the scope and spirit of the invention.

What is claimed is:

1. A method for minimizing interference in an electronic device that has at least one victim device and that has at least one aggressor device characterized by a noise spectrum, comprising:
   with control circuitry in the electronic device, determining whether to modify the noise spectrum to minimize interference between the aggressor device and the victim device; and
   in response to determining that the noise spectrum is to be modified to minimize interference, activating data scrambling in the electronic device.

2. The method defined in claim 1 further comprising:
   in response to determining that the noise spectrum is to be modified to minimize interference, activating spread spectrum clocking in the electronic device.

3. The method defined in claim 1 wherein the aggressor device comprises a clock, the method comprising:
   in response to determining that the noise spectrum is to be modified to minimize interference, using the control circuitry to direct the clock to use spread spectrum clocking.

4. The method defined in claim 1 wherein the aggressor device comprises a transmitter, the method comprising:
   in response to determining that the noise spectrum is to be modified to minimize interference, using the control circuitry to direct the transmitter to use the data scrambling.

5. The method defined in claim 1 wherein the victim device comprises a wireless radio-frequency receiver and wherein the aggressor device comprises a clock, the method comprising:
   in response to determining that the noise spectrum is to be modified to minimize interference, using the control circuitry to direct the clock to use spread spectrum clocking in producing a clock signal output to minimize interference between the clock and the wireless radio-frequency receiver.

6. The method defined in claim 1 wherein the victim device comprises a wireless radio-frequency receiver and wherein the aggressor device comprises a transmitter, the method comprising:
   in response to determining that the noise spectrum is to be modified to minimize interference, using the control circuitry to direct the transmitter to use the data scrambling in transmitting data to minimize interference between the transmitter and the wireless radio-frequency receiver.

7. The method defined in claim 1 wherein the victim device comprises a wireless radio-frequency receiver, the method comprising:
   in response to determining that the noise spectrum is to be modified to minimize interference, using spread spectrum clocking and the data scrambling within the electronic device.

8. The method defined in claim 1 wherein the aggressor device comprises a clock circuit, the method further comprising:
   with the control circuitry, adjusting a clock frequency setting for the clock circuit to adjust a clock frequency associated with a clock signal produced by the clock circuit to minimize the interference between the clock circuit and the victim device.

9. The method defined in claim 8 wherein the aggressor device comprises a clock circuit, wherein the victim device comprises a display characterized by a blanking interval, and wherein adjusting the clock frequency setting comprises adjusting the clock frequency setting during the blanking interval.

10. The method defined in claim 1 wherein the aggressor device comprises a clock circuit and wherein the victim device comprises a display characterized by a blanking interval, the method further comprising:
controlling use of spread spectrum clocking by the clock circuit in real time to minimize interference between the clock circuit and the display, wherein controlling the use of spread spectrum clocking comprises transitioning between active and inactive spread spectrum clocking modes during the blanking interval.

11. An electronic device, comprising:
wireless communications circuitry including at least one receiver;
at least one clock circuit that includes spread spectrum control circuitry; and
control circuitry that dynamically controls the spread spectrum control circuitry to selectively enable spread spectrum clocking in the clock circuit to minimize interference between the clock circuit and the receiver.

12. The electronic device defined in claim 11 further comprising a display, wherein the clock circuit is configured to produce a clock signal that is used by the display.

13. The electronic device defined in claim 11 further comprising a camera, wherein the clock circuit is configured to produce a clock signal that is used by the camera.

14. The electronic device defined in claim 11 further comprising a transmitter that includes a data scrambler, wherein the control circuitry is configured to control the data scrambler to minimize interference between the clock circuit and the receiver.

15. The electronic device defined in claim 11 wherein the control circuitry is configured to adjust the clock circuit to make frequency adjustments to a clock signal produced by the clock circuit that minimize interference between the clock circuit and the receiver.

16. A method of operating an electronic device that includes wireless receiver circuitry and a circuit that produces radio-frequency noise characterized by a noise spectrum, wherein the circuit is adjustable to selectively broaden the noise spectrum, the method comprising:
with control circuitry in the electronic device, adjusting the noise spectrum to minimize interference between the circuit and the wireless receiver by adjusting the circuit, wherein the circuit comprises a clock circuit and wherein adjusting the noise spectrum comprises adjusting the clock circuit to broaden and weaken the noise spectrum in real time by adjusting spread spectrum clocking circuitry in the clock circuit at least partly in response to which communications bands are being received by the wireless receiver circuitry.

17. The method defined in claim 16, wherein adjusting the noise spectrum also comprises adjusting the clock circuit to narrow and strengthen the noise spectrum in real time.

18. The method defined in claim 16, wherein the circuit comprises a transmitter, and wherein adjusting the transmitter comprises adjusting data scrambling circuitry in the transmitter at least partly in response to which communications bands are being received by the wireless receiver circuitry.

19. A method of operating an electronic device that includes wireless receiver circuitry and a circuit that produces radio-frequency noise characterized by a noise spectrum, wherein the circuit is adjustable to selectively broaden the noise spectrum, the method comprising:
with control circuitry in the electronic device, adjusting the noise spectrum to minimize interference between the circuit and the wireless receiver by adjusting the circuit, wherein the circuit comprises a transmitter, wherein adjusting the noise spectrum comprises adjusting the transmitter to narrow and strengthen the noise spectrum in real time, and wherein adjusting the transmitter comprises adjusting data scrambling circuitry in the transmitter at least partly in response to which communications bands are being received by the wireless receiver circuitry.

* * * * *